US011456315B2

(12) United States Patent
Lu et al.

(10) Patent No.: US 11,456,315 B2
(45) Date of Patent: Sep. 27, 2022

(54) DUAL DECK THREE-DIMENSIONAL NAND MEMORY WITH CHANNEL DIPS AND METHOD FOR FORMING THE SAME

(71) Applicant: Yangtze Memory Technologies Co., Ltd., Hubei (CN)

(72) Inventors: Feng Lu, Hubei (CN); Jing Gao, Hubei (CN); Wenbin Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 2 days.

(21) Appl. No.: 16/909,566

(22) Filed: Jun. 23, 2020

(65) Prior Publication Data
US 2021/0225866 A1 Jul. 22, 2021

Related U.S. Application Data

(63) Continuation of application No. PCT/CN2020/072624, filed on Jan. 17, 2020.

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC .......................................... H01L 27/115–11597
See application file for complete search history.

(56) References Cited

U.S. PATENT DOCUMENTS

| 8,541,831 B2* | 9/2013 | Chae ................... H01L 29/408 |
| | | 257/329 |
| 10,141,331 B1* | 11/2018 | Susuki ............. H01L 27/11582 |
| 10,319,864 B2* | 6/2019 | Kim ................. H01L 29/40117 |
| 10,381,369 B2 | 8/2019 | Kim et al. |
| 10,515,975 B1 | 12/2019 | Tao et al. |
| 10,651,192 B2 | 5/2020 | Xu et al. |

(Continued)

FOREIGN PATENT DOCUMENTS

| CN | 106920772 A | 7/2017 |
| CN | 107431063 A | 12/2017 |

(Continued)

*Primary Examiner* — Stephen M Bradley
*Assistant Examiner* — Gustavo G Ramallo
(74) *Attorney, Agent, or Firm* — Sterne, Kessler, Goldstein & Fox P.L.L.C.

(57) ABSTRACT

A method for forming a three-dimensional (3D) memory device is disclosed. In some embodiments, the method includes forming an alternating dielectric stack on a substrate, and forming a plurality of channel holes penetrating the alternating dielectric stack vertically to expose at least a portion of the substrate. A first mask can be formed to cover the channel holes in a first area and expose the channel holes in a second area. The method also includes forming a recess in the alternating dielectric stack in the second area, followed by forming a second mask in the recess. The second mask covers the channel holes in the second area and exposes the channel holes in the first area. The memory film at bottom of each channel hole in the first area can therefore be removed, while the memory film in the second area can be protected by the second mask.

14 Claims, 17 Drawing Sheets

(56) References Cited

U.S. PATENT DOCUMENTS

| | | |
|---|---|---|
| 10,672,790 B2 | 6/2020 | Yu et al. |
| 2012/0003800 A1 | 1/2012 | Lee et al. |
| 2016/0005760 A1* | 1/2016 | Lee .................... H01L 27/1157 |
| | | 257/324 |
| 2016/0126252 A1* | 5/2016 | Tsuda ................. H01L 21/0217 |
| | | 438/269 |
| 2016/0126253 A1* | 5/2016 | Lee ................... H01L 27/11582 |
| | | 257/329 |
| 2016/0204102 A1 | 7/2016 | Chen |
| 2017/0077140 A1 | 3/2017 | Arai |
| 2017/0365616 A1 | 12/2017 | Kang et al. |
| 2018/0151672 A1* | 5/2018 | Choi ................. H01L 27/11524 |
| 2018/0174960 A1 | 6/2018 | Smith et al. |
| 2019/0164990 A1* | 5/2019 | Kanamori ................ G11C 5/06 |
| 2019/0312054 A1 | 10/2019 | Yun et al. |
| 2021/0036007 A1* | 2/2021 | Oh .................... H01L 21/02636 |

FOREIGN PATENT DOCUMENTS

| | | |
|---|---|---|
| CN | 108417576 A | 8/2018 |
| CN | 108461502 A | 8/2018 |
| CN | 109196645 A | 1/2019 |
| CN | 109817639 A | 5/2019 |
| CN | 110277403 A | 9/2019 |
| CN | 110364533 A | 10/2019 |
| TW | 201834147 A | 9/2018 |
| WO | WO 2016/205078 A2 | 12/2016 |

\* cited by examiner

DUAL DECK THREE-DIMENSIONAL NAND MEMORY WITH CHANNEL DIPS AND METHOD FOR FORMING THE SAME

CROSS-REFERENCE TO RELATED APPLICATIONS AND INCORPORATION BY REFERENCE

This application claims priority to PCT/CN2020/072624 filed on Jan. 17, 2020, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

To further increase storage capacity in a 3D memory, the number of vertically stacked memory cells has been increased greatly while the lateral dimensions of the memory cells are reduced. As a result, the aspect ratio of the 3D memory cells has increased significantly, introducing complexity in manufacturing. For example, it is challenging to form channel layers without damaging the memory films on the sidewalls of the channel holes. Thus, a need exists for an improvement in fabrication process for a 3D memory to achieve high density and good reliability.

BRIEF SUMMARY

Embodiments of a three-dimensional (3D) memory device and methods for forming the same are described in the present disclosure.

One aspect of the present disclosure provides a method for forming a three-dimensional (3D) memory device that includes forming an alternating dielectric stack on a substrate, and forming a plurality of channel holes, where the plurality of channel holes penetrate the alternating dielectric stack vertically, in a direction perpendicular to the substrate, to expose at least a portion of the substrate. The method also includes forming a first mask covering the plurality of channel holes in a first area and exposing the plurality of channel holes in a second area. The method further includes forming a recess in the alternating dielectric stack in the second area. The method also includes forming a second mask in the recess, where the second mask covers the plurality of channel holes in the second area and exposes the plurality of channel holes in the first area. The method further includes forming dips at bottom of the plurality of channel holes in the first area.

In some embodiments, forming the first mask includes disposing a hard mask layer to cover the plurality of channel holes, where the hard mask layer does not fill inside the plurality of channel holes. A first photoresist mask can then be formed on top of the hard mask layer, and patterns of the first photoresist mask can be transferred to the hard mask layer.

In some embodiments, disposing the hard mask layer includes disposing an amorphous carbon layer.

In some embodiments, forming the alternating dielectric stack includes forming a plurality of dielectric layer pairs stacked vertically in the direction perpendicular to the substrate, where each dielectric layer pair includes a first dielectric layer and a second dielectric layer that is different from the first dielectric layer.

In some embodiments, forming the recess in the alternating dielectric stack includes removing one or more pairs of the first and second dielectric layers.

In some embodiments, the method also includes disposing epitaxial layers on the exposed portion of substrate inside the plurality of channel holes. In some embodiments, the method further includes disposing a memory film on sidewalls of the plurality of channel holes and top surfaces of the epitaxial layers. In some embodiments, the method also includes disposing a first capping layer on the memory film.

In some embodiments, the method further includes disposing a channel layer on sidewalls of the memory films and on the epitaxial layers inside the plurality of channel holes after forming dips at the bottom of the plurality of channel holes in the first area. The method also includes disposing a core filling film inside the plurality of the channel holes, and removing excess core filling film, channel layer and memory films outside the plurality of channel holes.

In some embodiments, the removal of the excess core filling film, channel layer and memory films outside the plurality of channel holes comprises chemical mechanical polishing.

In some embodiments, after removing excess core filling film, channel layer and memory films outside the plurality of channel holes, top contact structures are formed in upper portions of the plurality of channel holes in the first area, where the top contact structures are connected with the channel layers inside the plurality of the channel holes.

In some embodiments, forming a second mask in the recess includes disposing a second photoresist mask over the alternating dielectric stack in the second area, where the second photoresist mask does not fill inside the plurality of channel holes. The second photoresist mask is then planarized to form a top surface coplanar with the alternating dielectric stack.

In some embodiments, forming dips at the bottom of the plurality of channel holes includes disposing a second capping layer inside the plurality of channel holes in the first area and on top of the second mask in the second area, followed by removing the second capping layer from the bottom of the plurality of channel holes in the first area to expose the substrate or an epitaxial layer on the substrate.

In some embodiments, the method further includes replacing the alternating dielectric stack with a film stack of alternating conductive and dielectric layers.

Another aspect of the present disclosure provides a dual deck three-dimensional (3D) memory device that includes an alternating dielectric stack with an upper deck and a lower deck disposed on a substrate, each deck including alternatingly stacked first and second dielectric layers in a direction perpendicular to the substrate, where the second dielectric layer is different from the first dielectric layer. The dual deck 3D memory device also includes a plurality of channel holes penetrating through the upper and lower decks of the alternating dielectric stack into the substrate. The dual deck 3D memory device further includes a memory film, a channel layer, and a core filling film covering a sidewall of each of the plurality of channel holes. The dual deck 3D memory device also includes a dip at a bottom of each of the plurality of channel holes in a first area, and a recess in the upper deck of the alternating dielectric stack in a second area.

In some embodiments, the dual deck 3D memory device also includes an epitaxial layer at the bottom of each of the plurality of channel holes, where the epitaxial layer is connected to the channel layer through the dip in the first area; and the memory film is sandwiched between the epitaxial layer and the channel layer in the second area.

In some embodiments, the dual deck 3D memory device further includes a capping layer sandwiched between the epitaxial layer and the channel layer at the bottom of each of the plurality of channel holes in the second area.

In some embodiments, the recess in the upper deck of the alternating dielectric stack in the second area includes the epitaxial layer and the core filling film.

In some embodiments, the dual deck 3D memory device further includes a top contact structure on top of the core filling film inside each of the plurality of channel holes in the first area, where the top contact structure is connected with the channel layer.

In some embodiments, the alternating dielectric stack is coplanar with the top contact structure in the first area and coplanar with the core filling film inside the recess in the second area.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
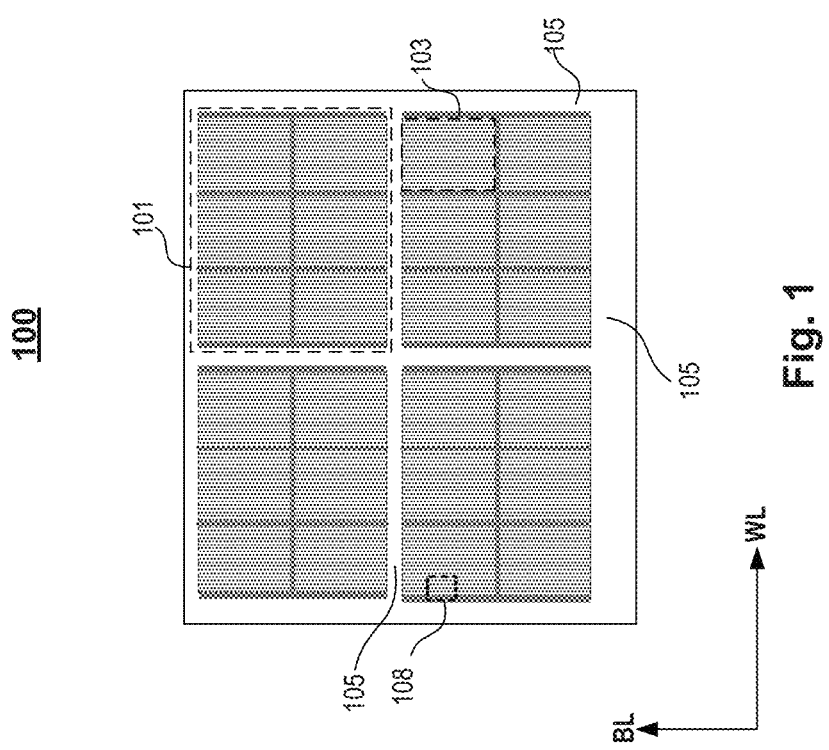
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
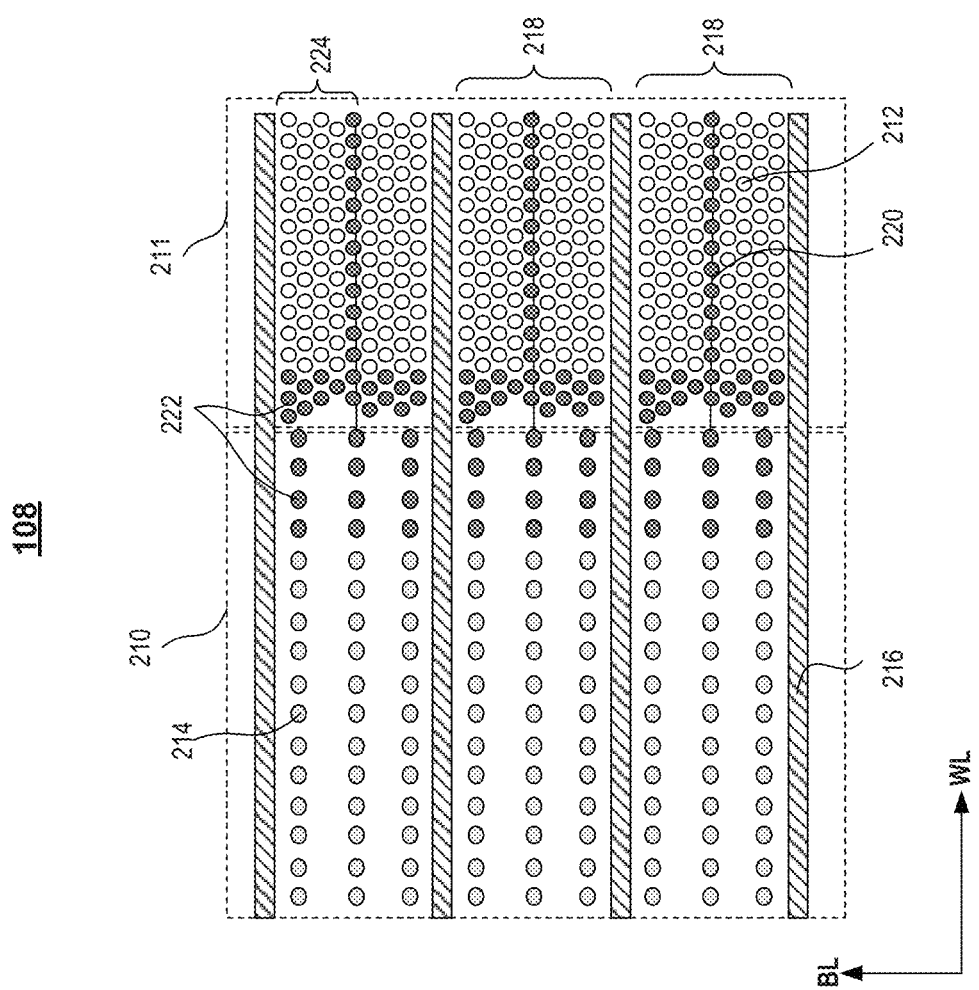
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
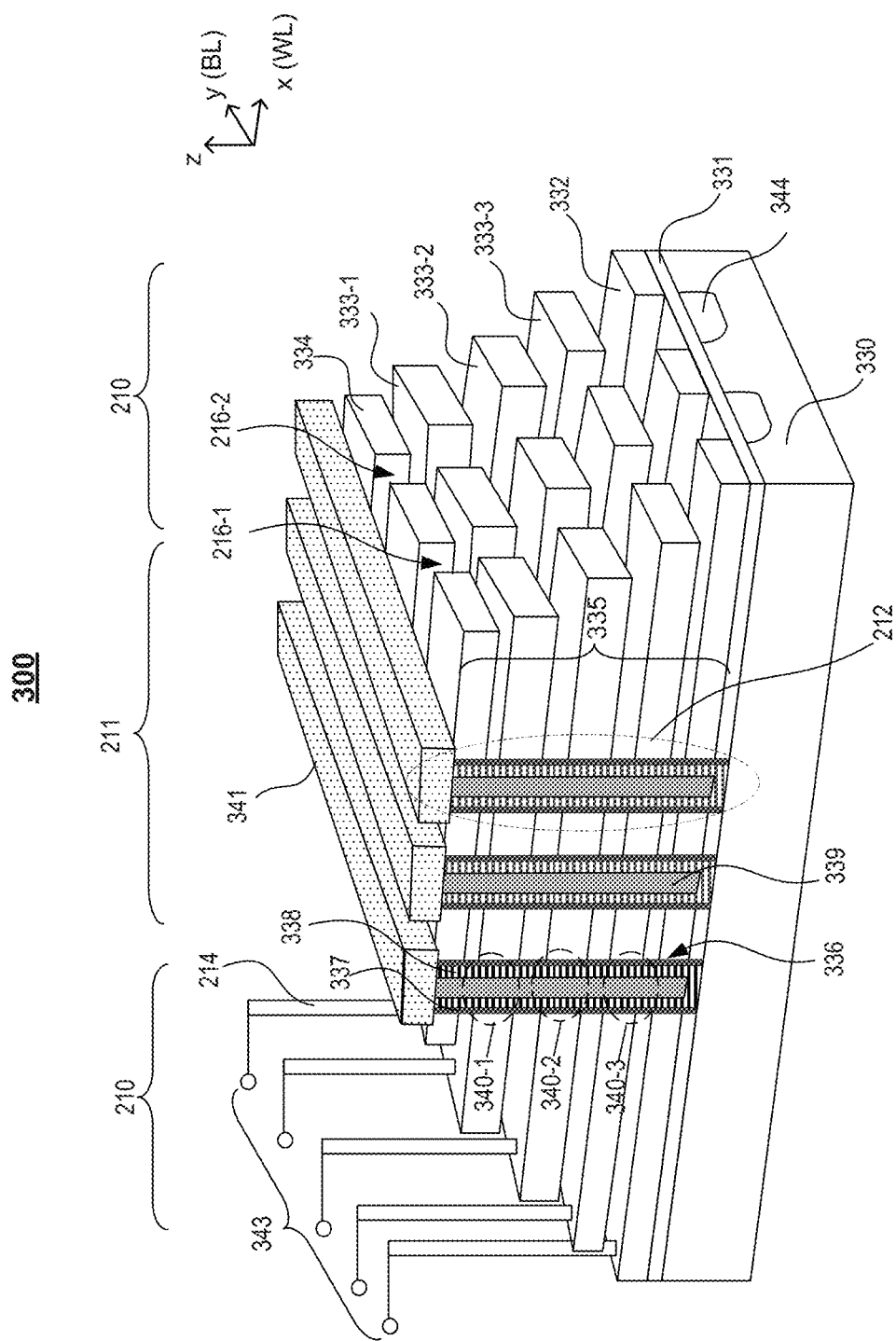
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy memory string. These structures are not shown in FIG. 3 for simplicity.

To pursue higher storage capacity in a 3D memory, the number of vertically stacked memory cells has been increased greatly. As a result, the number of control gates or word lines 333 has been increased greatly. The total thickness of the film stack 335 of alternating conductive and dielectric layers has been increased accordingly. In the meantime, the lateral dimensions of the memory strings 212 have been reduced to further increase the density of memory cells 340 and the storage capacity of the 3D memory. Therefore, the aspect ratio of the memory string 212 has been increased significantly, introducing many challenges in various processes, for example, etching process to form the channel holes 336 through the entire film stack 335, and removing memory film from the bottom of the channel holes 336 to connect the channel layer 338 with an epitaxial layer or the substrate 330.

Dual deck structure has been developed in light of the complexity in the manufacturing of 3D memory. In a dual deck 3D memory, vertically stacked memory cells are divided into two sections, an upper deck and a lower deck, where the upper and lower decks can be formed sequentially. For example, the lower deck of the film stack 335 can be formed first, where the channel holes 336 can be etched for the lower deck only. Then, the upper deck of the film 335 can be formed on top of the lower deck, where the channel holes can be etched again for the upper deck by using a separate lithography process. The dual deck structure and two-step processes can reduce complexity of high aspect ratio etching or film deposition. However, additional lithography steps can cause overlay errors between the upper and lower decks. For example, the memory film 337 in the lower deck can be damaged if it is exposed during the channel hole etching for the upper deck, which can cause leakage in word lines.

Generally, the overlay errors between the upper and lower decks are larger in the staircase region 210 (in FIG. 2) compared with the channel structure region 211 because of smaller lithography process window due to the topology of the staircase structure. In addition, to provide sufficient structure support for the 3D memory, channel holes for dummy memory strings 222 in the staircase region 210 are typically designed with larger dimensions than those for memory strings 212 in the channel structure region 211. In general, larger channel holes can be etched faster, which can introduce deeper gouging at the interface between the upper and lower decks, leading to larger word line leakage.

In this disclosure, improved method for forming channel holes 336 and channel layers 338 in a dual deck 3D memory is disclosed. By adding two lithography masks and revising fabrication processes, desired channel structures (e.g., channel hole, memory film, channel layer) can be formed in the channel structure region 211 for memory strings 212 while memory film damage or sidewall gouging in the dummy area (e.g., the staircase region 210) can be minimized.

Figure 4:
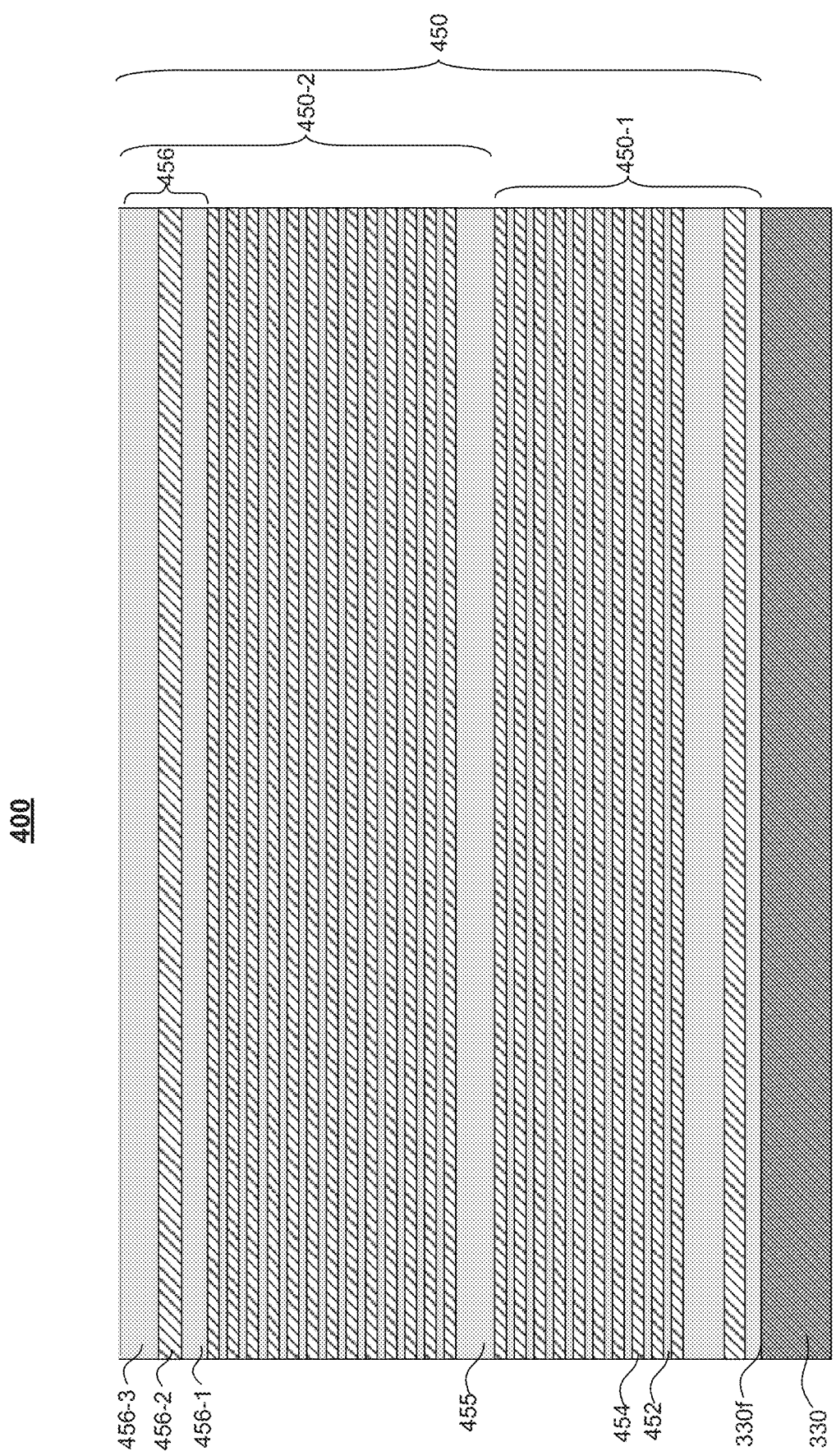
FIGS. 4-16 illustrate cross-sectional views of exemplary 3D memory devices at various fabricating stages, according to some embodiments of the present disclosure.

FIG. 4 illustrates a cross-sectional view of a 3D memory device 400 with dual decks, according to some embodiments of the present disclosure. The 3D memory device 400 includes an alternating dielectric stack 450 disposed on a substrate (e.g., the substrate 330), where the alternating dielectric stack 450 includes a lower deck 450-1 and an upper deck 450-2.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the alternating dielectric stack 450 includes a plurality of dielectric layer pairs alternatingly stacked on top of each other, where each dielectric layer pair includes a first dielectric layer 452 (also referred to as "dielectric layer") and a second dielectric layer 454 (also referred to as "sacrificial layer") that is different from the first dielectric layer 452. The alternating dielectric stack 450 extends in a lateral direction that is parallel to the front surface 330f of the substrate 330.

In the alternating dielectric stack 450, first dielectric layers 452 and second dielectric layers 454 alternate in a vertical direction, perpendicular to the substrate 330. In the other words, each second dielectric layer 454 can be sandwiched between two first dielectric layers 452, and each first dielectric layer 452 can be sandwiched between two second dielectric layers 454 (except the bottommost and the topmost layer).

The formation of the alternating dielectric stack 450 can include disposing the first dielectric layers 452 to each have the same thickness or to have different thicknesses. Example thicknesses of the first dielectric layers 452 can range from 10 nm to 500 nm, preferably about 25 nm. Similarly, the second dielectric layer 454 can each have the same thickness or have different thicknesses. Example thicknesses of the second dielectric layer 454 can range from 10 nm to 500 nm, preferably about 35 nm. It should be understood that the number of dielectric layer pairs in FIG. 4 is for illustrative purposes only and that any suitable number of layers may be included in the alternating dielectric stack 450.

In some embodiments, the first dielectric layer 452 includes any suitable insulating materials, for example, silicon oxide, silicon oxynitride, silicon nitride, TEOS or silicon oxide with F-, C-, N-, and/or H-incorporation. The first dielectric layer 452 can also include high-k dielectric materials, for example, hafnium oxide, zirconium oxide, aluminum oxide, tantalum oxide, or lanthanum oxide films. In some embodiments, the first dielectric layer 452 can be any combination of the above materials.

The formation of the first dielectric layer 452 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 454 includes any suitable material that is different from the first dielectric layer 452 and can be removed selectively with respect to the first dielectric layer 452. For example, the second dielectric layer 454 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 454 also includes amorphous semiconductor materials, such as amorphous silicon or amorphous germanium. The second dielectric layer 454 can be disposed using a similar technique as the first dielectric layer 452, such as CVD, PVD, ALD, thermal oxidation or nitridation, or any combination thereof.

In some embodiments, the first dielectric layer 452 can be silicon oxide and the second dielectric layer 454 can be silicon nitride.

In some embodiments, the alternating dielectric stack 450 can include layers in addition to the first dielectric layer 452 and the second dielectric layer 454, and can be made of different materials and/or with different thicknesses. For example, the interface 455 between the lower deck 450-1 and the upper deck 450-2 can include the first dielectric layer 452 and/or other dielectric materials with a different thickness.

The upper deck 450-2 of the alternating dielectric stack 450 also includes a channel connecting layer 456 at the top. In some embodiments, the channel connecting layer 456 can include a first insulating layer 456-1, a second insulating layer 456-2, and a third insulating layer 456-3. The first, second, and the third insulating layers 456-1, 456-2 and 456-3 can be made by any suitable insulating material and/or dielectric material. In some embodiments, the first and the third insulating layers 456-1 and 456-3 can include silicon oxide, and the second insulating layer 456-2 can include silicon nitride. The channel connecting layer 456 can be formed by using a thin film deposition process, such as a chemical vapor deposition (CVD) process (e.g., PECVD, LPCVD, RTCVD, MOCVD), Atomic Layer Deposition (ALD), sputtering, or any other suitable processes.

In addition to the alternating dielectric stack 450, in some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. In some embodiments, the substrate 330 can further include an insulating film 331 on the front surface 330f (not shown in FIG. 4). The insulating film 331 can be made of the same or different material from the alternating dielectric stack 450.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

Figure 5:
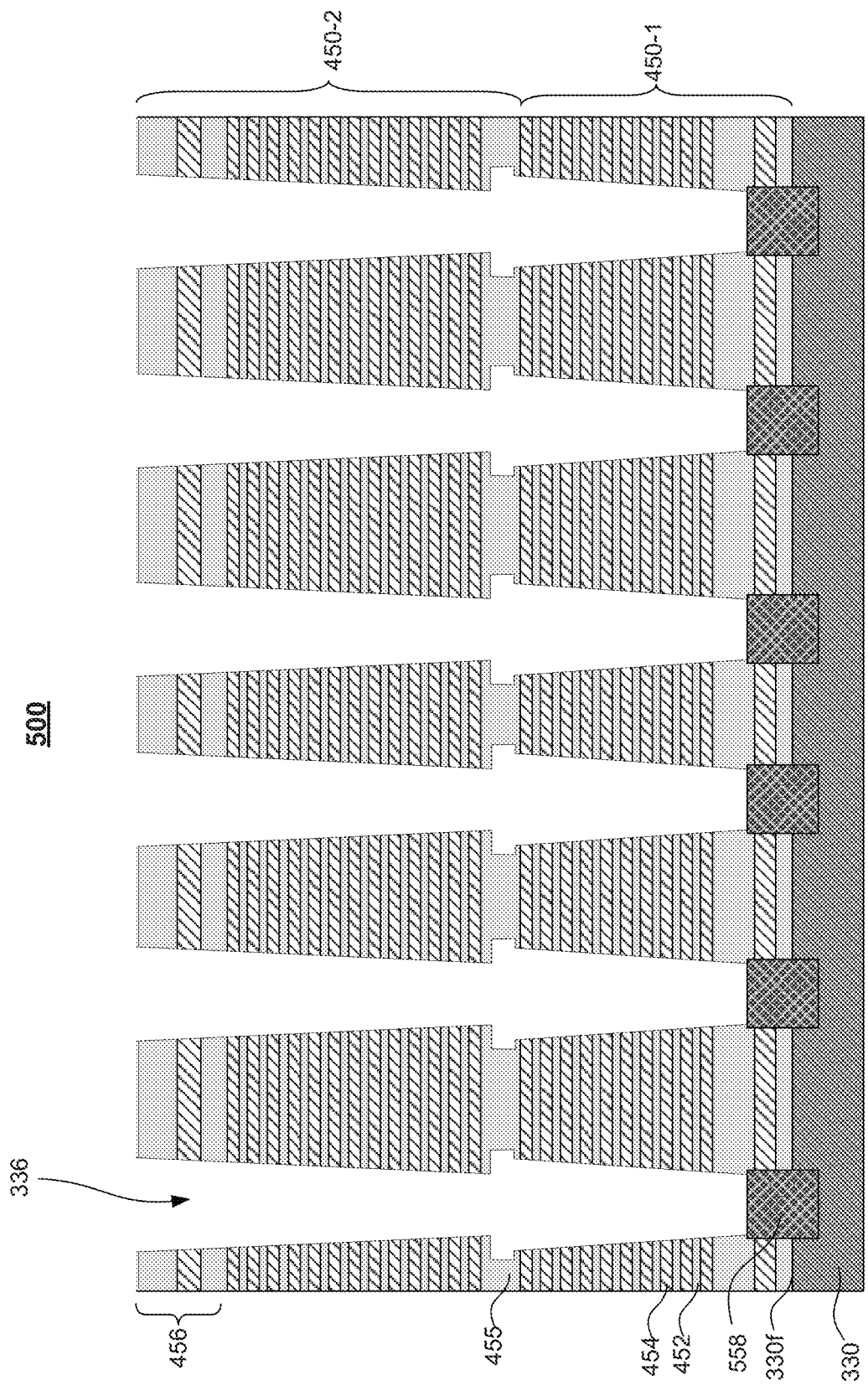

FIG. 5 illustrates a cross-sectional view of a 3D memory device 500, according to some embodiments of the present disclosure. The 3D memory device 500 includes a plurality of channel holes (e.g., the channel holes 336) formed in the alternating dielectric stack 450, penetrating entire alternating dielectric stack 450 (including both upper deck 450-2 and lower deck 450-1) and extending into the substrate 330.

In some embodiments, forming of the channel holes 336 includes processes such as photolithography and etching. In some embodiments, a carbon-based polymer material or a hard mask can be used in addition to photoresist for the etching process. The hard mask can include silicon oxide, silicon nitride, TEOS, silicon-containing anti-reflective coating (SiARC), amorphous silicon, or polycrystalline silicon, or any combination thereof. The etching process to form the channel holes 336 can include a dry etching, a wet etching, or a combination thereof. In some embodiments, the alternating dielectric stack 450 can be etched using an anisotropic etching such as a reactive ion etch (RIE). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first and second dielectric layers 452/454 should not be limited by the embodiments of the present disclosure.

In some embodiments, the channel holes 336 can be formed by the same lithography mask and etching process, where all the channel holes in the staircase region 210 and the channel structure region 211 are opened simultaneously. In some embodiments, the channel holes in the channel structure region 211 and in the staircase region 210 can be formed with different lithography masks and etching processes. For example, the channel holes in the staircase region 210 can be formed first with certain lithography mask and etching process, and the channel holes in the channel structure region 211 can be formed subsequently with another lithography mask and a different etching process.

In some embodiments, the channel holes 336 can be formed by etching through the lower deck 450-1 and upper deck 450-2 sequentially. In this example, the lower deck 450-1 can be disposed on the substrate 330 and a plurality of first openings (not shown) can be formed in the lower deck 450-1. Then a filling material can be disposed inside the plurality of first openings. The upper deck 450-2 can be disposed over the lower deck after the deposition of the filling material. A plurality of second openings can then be formed in the upper deck 450-2 with a separate lithography mask. The second openings can be aligned with the first openings such that after removing the filling material the channel holes 336 can be formed, extending through the entire alternating dielectric stack 450. The gouging at the interface 455 between the lower deck 450-1 and the upper deck 450-2 can be formed due to the removal process of the filling material or the extended etching process for the plurality of second openings in the upper deck 450-2.

In some embodiments, the 3D memory device 500 further includes an epitaxial layer 558 inside the channel hole 336. The epitaxial layer 558 can include any suitable semiconductor material, such as silicon, silicon germanium, germanium, gallium arsenide, gallium nitride, III-V compound, or any combination thereof. The epitaxial layer 558 can be epitaxially grown from the substrate 330. In some embodiments, the epitaxial layer 558 can be selectively grown from an exposed surface of the substrate 330 inside the channel hole 336. In some embodiments, the epitaxial layer 558 can be a polycrystalline semiconductor material, for example, polycrystalline silicon.

In some embodiments, the epitaxial layer 558 can be epitaxially grown from a doped region (not shown in FIG. 5) in the substrate 330. The doped region can be formed by ion implantation using p-type or n-type dopants, for example boron, phosphorus, arsenic, or any combination thereof. The ion implantation can be performed before the deposition of the alternating dielectric stack 450. In some embodiments, the ion implantation can be performed after channel hole etching.

Figure 6:
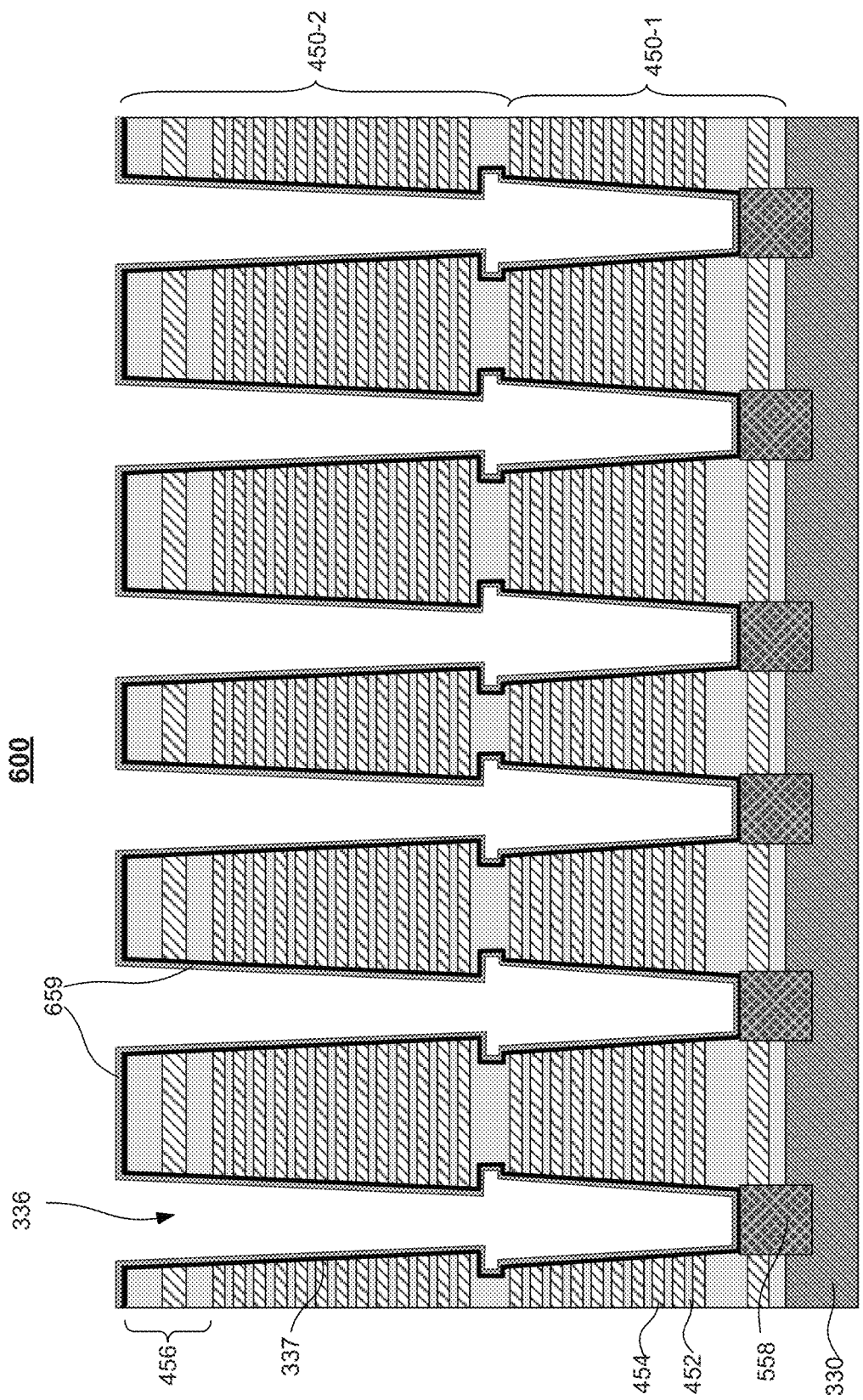

FIG. 6 illustrates a cross-sectional view of a 3D memory device 600, according to some embodiments of the present disclosure. The 3D memory device 600 includes a memory film (e.g., the memory film 337 in FIG. 3) disposed on the 3D memory device 500 (in FIG. 5). The memory film 337 can be disposed on a sidewall of each channel hole 336, a top surface of the epitaxial layer 558, and a top surface of the channel connecting layer 456.

In some embodiments, the memory film 337 can be a composite layer including a tunneling layer, a storage layer (also known as "charge trap/storage layer"), and a blocking layer. Each channel hole 336 can have a cylinder shape. The tunneling layer, the storage layer, and the blocking layer are arranged along a direction from the center toward the outer of the channel hole in the above order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, a first capping layer 659 can be disposed on the memory film 337 to protect it from being damaged in subsequent fabrication processes. In some embodiments, the first capping layer 659 can include an amorphous or polycrystalline silicon layer. In some embodiments, the first capping layer 659 can also include a silicon oxide, silicon oxynitride or silicon nitride layer. The first capping layer 659 can be formed by using a thin film deposition process, such as ALD, CVD, PVD, sputtering or any other suitable process. In some embodiments, a thickness of the first capping layer 659 can be in a range from about 10 nm to about 50 nm.

Figure 7:
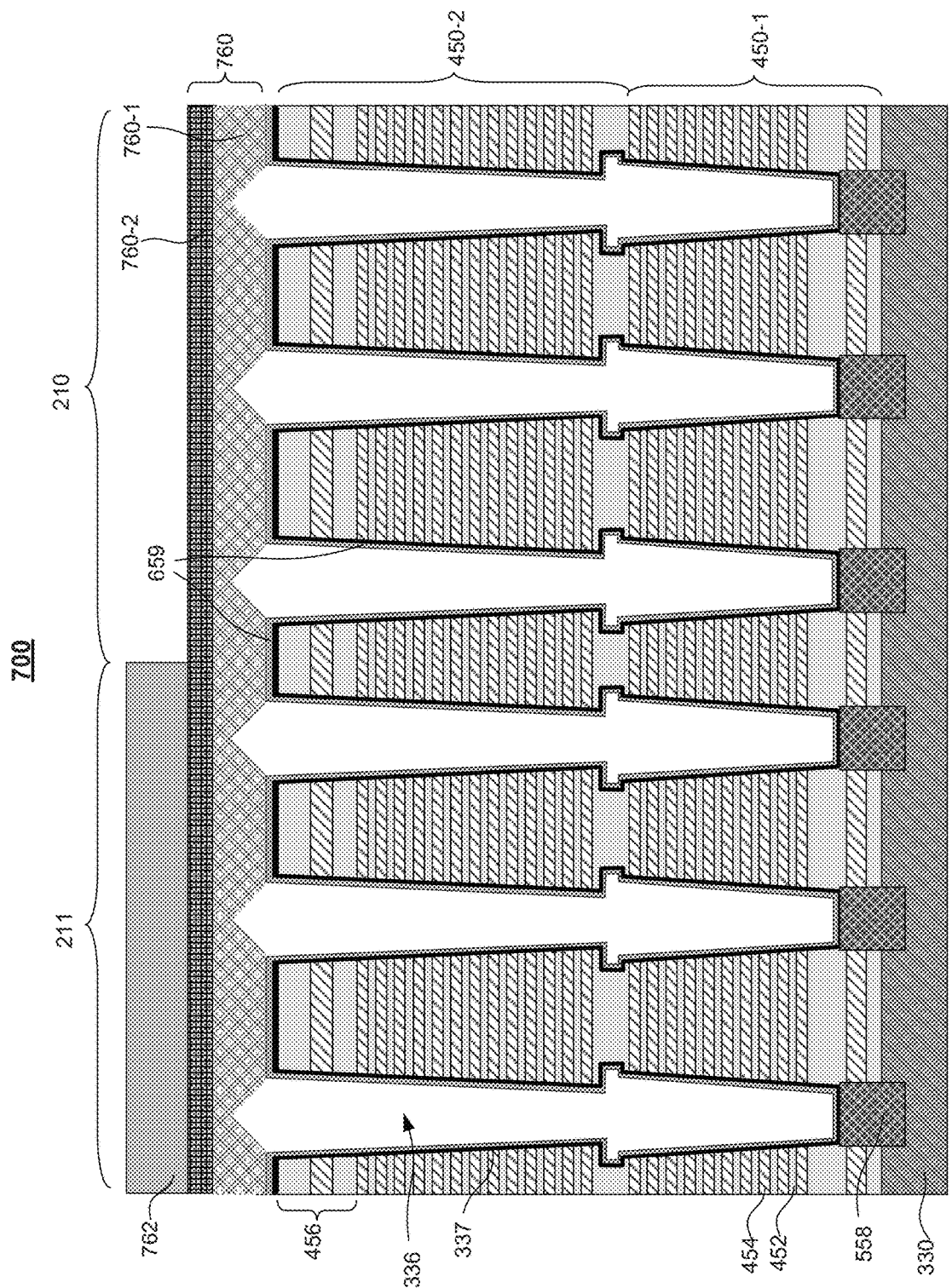

FIG. 7 illustrates a cross-sectional view of a 3D memory device 700, according to some embodiments of the present disclosure. The 3D memory device 700 includes a hard mask layer 760 and a first photoresist mask 762, disposed on the 3D memory device 600 (shown in FIG. 6).

The hard mask layer 760 can be used to provide protection to the underlying devices and materials during subsequent etching process. The hard mask layer 760 includes any suitable material that can withstand the etching process, for example, an amorphous carbon layer 760-1 and a dielectric mask layer 760-2.

The amorphous carbon layer 760-1 can provide an un-conformal film on top of 3D memory device 600, where the step-coverage over the channel hole 336 is low enough such that the amorphous carbon layer 760-1 is not disposed inside the channel hole 336. In the other words, the memory film 337 and the first capping layer 659 can be covered by the amorphous carbon layer 760-1 on the top of the channel connecting layer 456, where sidewalls of the memory film 337 and the first capping layer 659 inside the channel holes 336 can be exposed, without the amorphous carbon layer 760-1. The triangular shape in the amorphous carbon layer 760-1 over the channel hole 336 (as shown in FIG. 7) is for illustration purpose only, and can be any other suitable shape due to un-conformal deposition. The amorphous carbon layer 760-1 can be disposed by CVD, PVD, sputtering, or any other suitable deposition method. In some embodiments, the amorphous carbon layer 760-1 can be doped with other etch-resistant elements, such as boron, to improve the etch-resistance of the amorphous carbon.

In some embodiments, the dielectric mask layer 760-2 includes silicon oxide, silicon oxynitride or silicon nitride, disposed on top of the amorphous carbon layer 760-1. In some embodiments, the dielectric mask layer 760-2 can include a thin metal or metal oxide layer, such as zirconium oxide ($ZrO_2$), yttrium oxide ($Y_2O$), and aluminum oxide ($Al_2O_3$). The dielectric mask layer 760-2 can be disposed by CVD, ALD, PVD, sputtering, or any other suitable deposition method.

The hard mask layer 760 is not limited to the exemplary materials described herein. Other options may include high-k dielectric materials and/or any combinations thereof.

The first photoresist mask 762, formed by lithography, can be used to protect a first area (e.g., the channel structure region 211 in FIG. 2) and expose a second area (e.g., the staircase region 210 or any other dummy area). In some embodiments, the first photoresist mask 762 also includes an anti-reflective coating (ARC) such as dielectric ARC (DARC) or bottom ARC (BARC), used to improve lithography quality and provide extra protection during etching.

Figure 8:
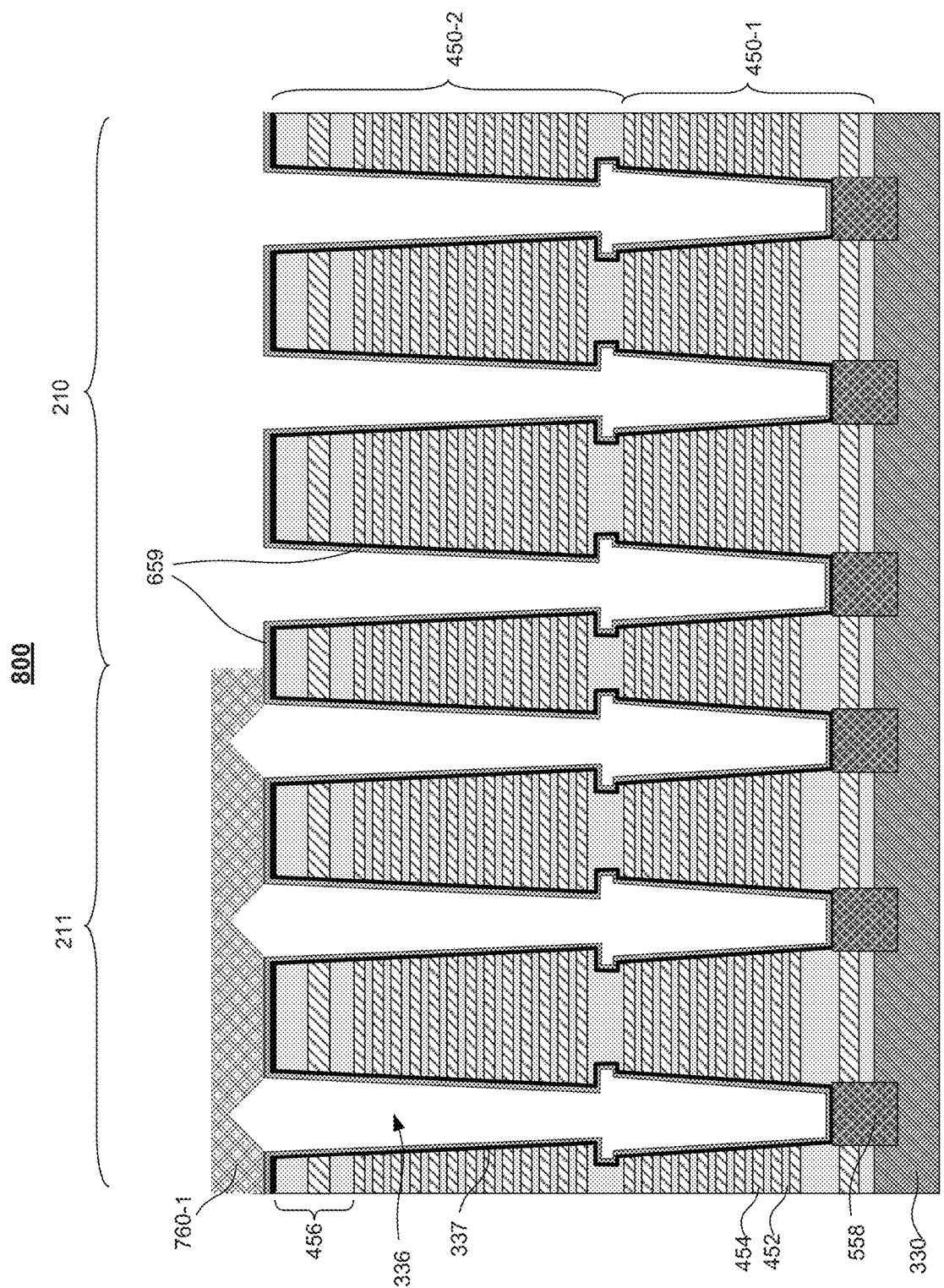

FIG. 8 illustrates a cross-sectional view of a 3D memory device 800, according to some embodiments of the present disclosure. The 3D memory device 800 includes a first mask (i.e., a portion of the hard mask layer 760 or the amorphous carbon layer 760-1), formed by a pattern transfer process from the first photoresist mask 762 in FIG. 7. Like the first photoresist mask 762, the first mask (or the amorphous carbon layer 760-1) exposes the channel holes 336 in the staircase region 210 and covers the channel holes 336 in the channel structure region 211.

In some embodiment, the pattern transfer process includes an etching process. The etching process includes dry etching, wet etching or a combination thereof. The dry etching can be reactive-ion etching (RIE) using oxygen ($O_2$) and/or fluorine (F) based gases such as carbon-fluorine ($CF_4$), hexafluoroethane ($C_2F_6$), and/or any other suitable gases.

After patterning the hard mask layer 760 (e.g., etching through the amorphous carbon layer 760-2), the first photoresist mask 762 and the dielectric mask layer 760-2 can be consumed, as shown in FIG. 8. In some embodiments, the first photoresist mask 762 and the dielectric mask layer 760-2 can remain on top of the amorphous carbon layer 760-2. In this example, the first photoresist mask 762 and/or the dielectric mask layer 760-2 can be removed after transferring the pattern to the amorphous carbon layer 760-2 prior to the subsequent process steps.

Figure 9:
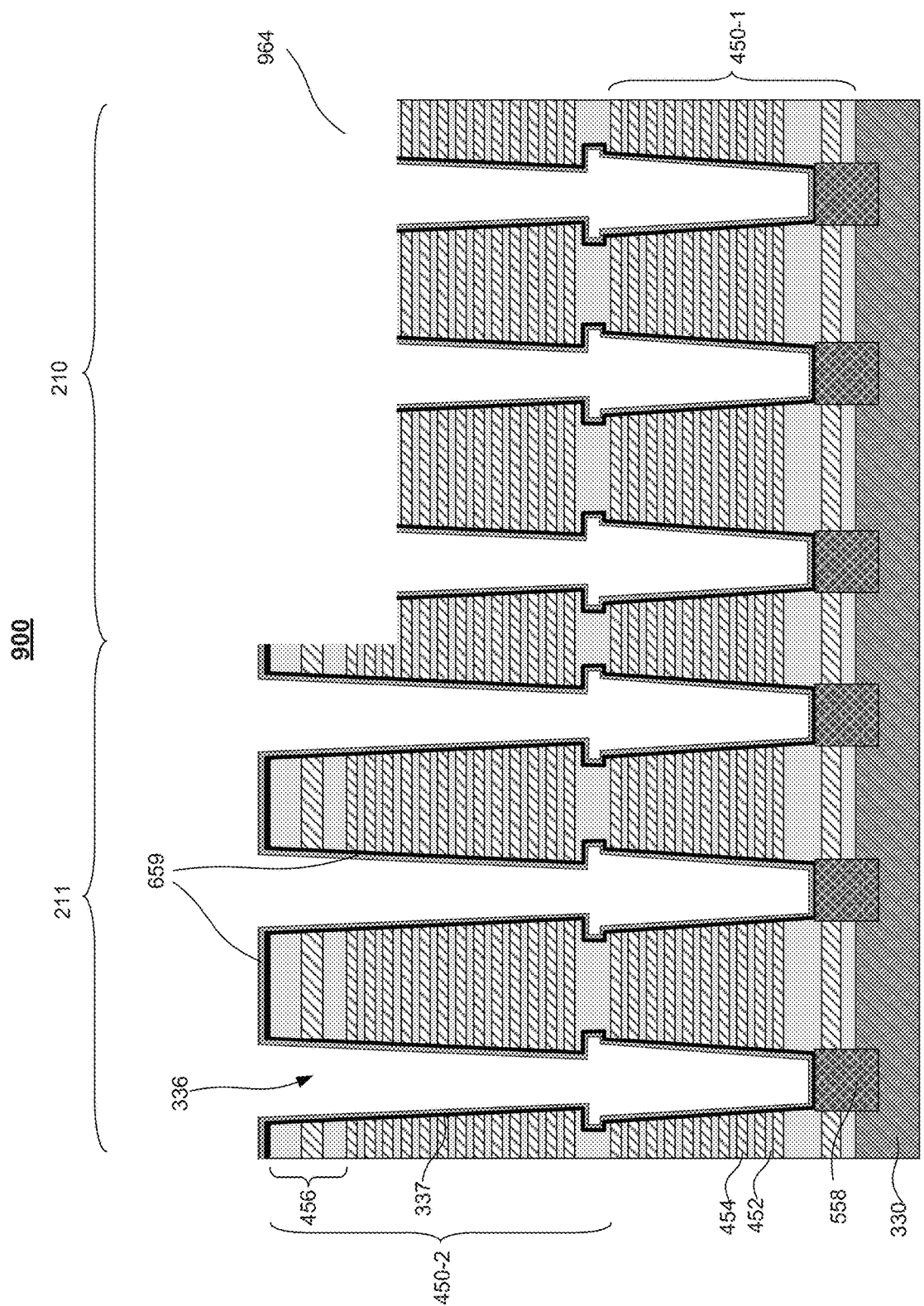

FIG. 9 illustrates a cross-sectional view of a 3D memory device 900, according to some embodiments of the present disclosure. The 3D memory device 900 includes a recess 964 in the staircase region 210. The recess 964 can be formed by etching through multiple pairs of the first and second dielectric layers 452/454 in the upper deck of the alternating dielectric stack 450-2 using the first mask (i.e., the patterned amorphous carbon layer 760-2 in FIG. 8).

As shown in FIG. 9, the channel connecting layer 456 and the top three pairs of the first and second dielectric layers 452/454 can be removed in the staircase region 210. In some embodiments, different number of first/second dielectric layers can be removed. Depending on the design of the first photoresist mask 762 in FIG. 7, the channel connecting layer 456 and the multiple pairs of first/second dielectric layers 452/454 can also be removed in various dummy areas on the wafer other than the staircase region 210.

In some embodiment, the channel connecting layer 456 and the first and second dielectric layers 452/454 can be removed by dry etching, wet etching or a combination thereof. The dry etching can include RIE with $CF_4$, $CHF_3$, $C_2F_6$, or any other suitable gases. After the etching process, the amorphous carbon layer 760-2 in FIG. 8 can be removed.

Figure 10:
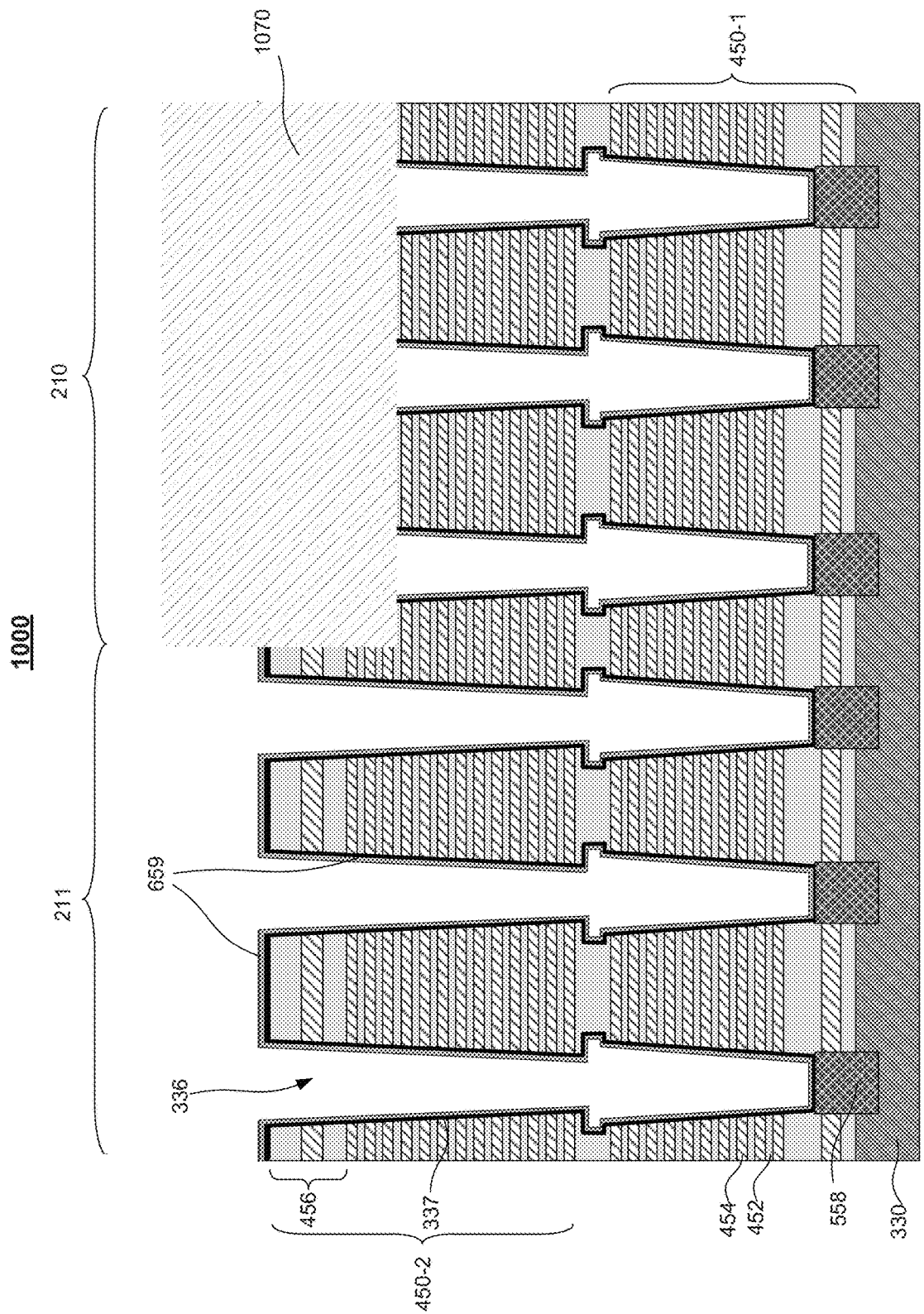

FIG. 10 illustrates a cross-sectional view of a 3D memory device 1000, according to some embodiments of the present disclosure. The 3D memory device 1000 includes a second photoresist mask 1070, covering the staircase region 210 and exposing the channel structure region 211.

The second photoresist mask 1070 can be formed by lithography and can include any photoresist with a viscosity such that the photoresist can fill the recess 964 (shown in FIG. 9) of a larger dimension without filling the channel holes 336 with small dimensions. In some embodiments, an ashing process (e.g., oxygen plasma etching) can be performed to remove undesired photoresist residuals inside the channel holes 336 in the channel structure region 211.

Figure 11:
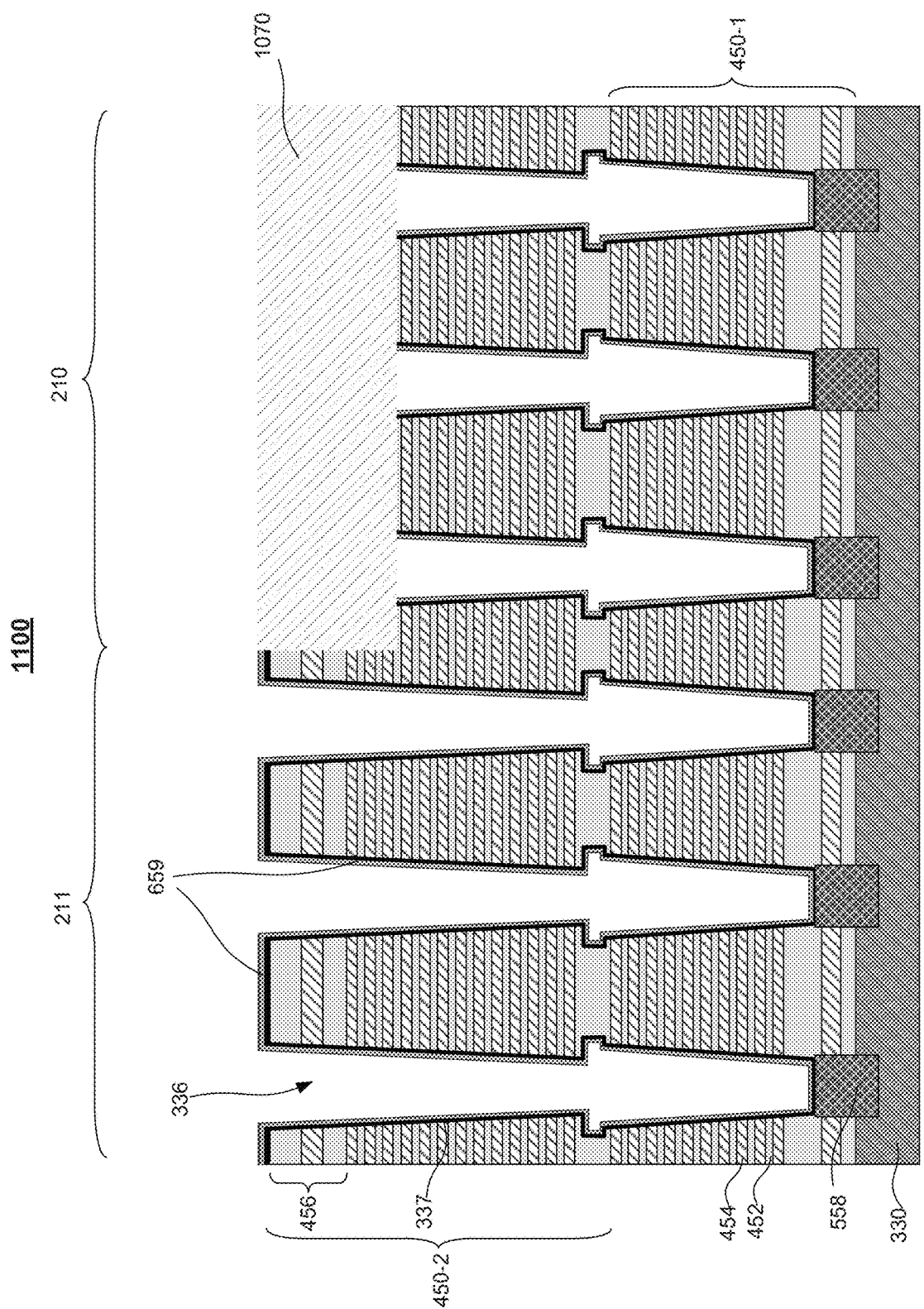

FIG. 11 illustrates a cross-sectional view of a 3D memory device 1100, according to some embodiments of the present disclosure. The 3D memory device 1100 includes a second mask (i.e., a portion of the second photoresist mask 1070). The 3D memory device 1100 can be formed by planarizing the second photoresist mask 1070 of the 3D memory device 1000 in FIG. 10 to form a coplanar top surface. In the 3D memory device 1100, top surfaces of the second photoresist mask 1070 and the first capping layer 659 on top of the channel connecting layer 456 are coplanar. In some embodiments, the planarization process includes etch-back RIE with $O_2$, $CF_4$ or other suitable gases. In some embodiments, the planarization process includes chemical mechanical polishing.

Figure 12:
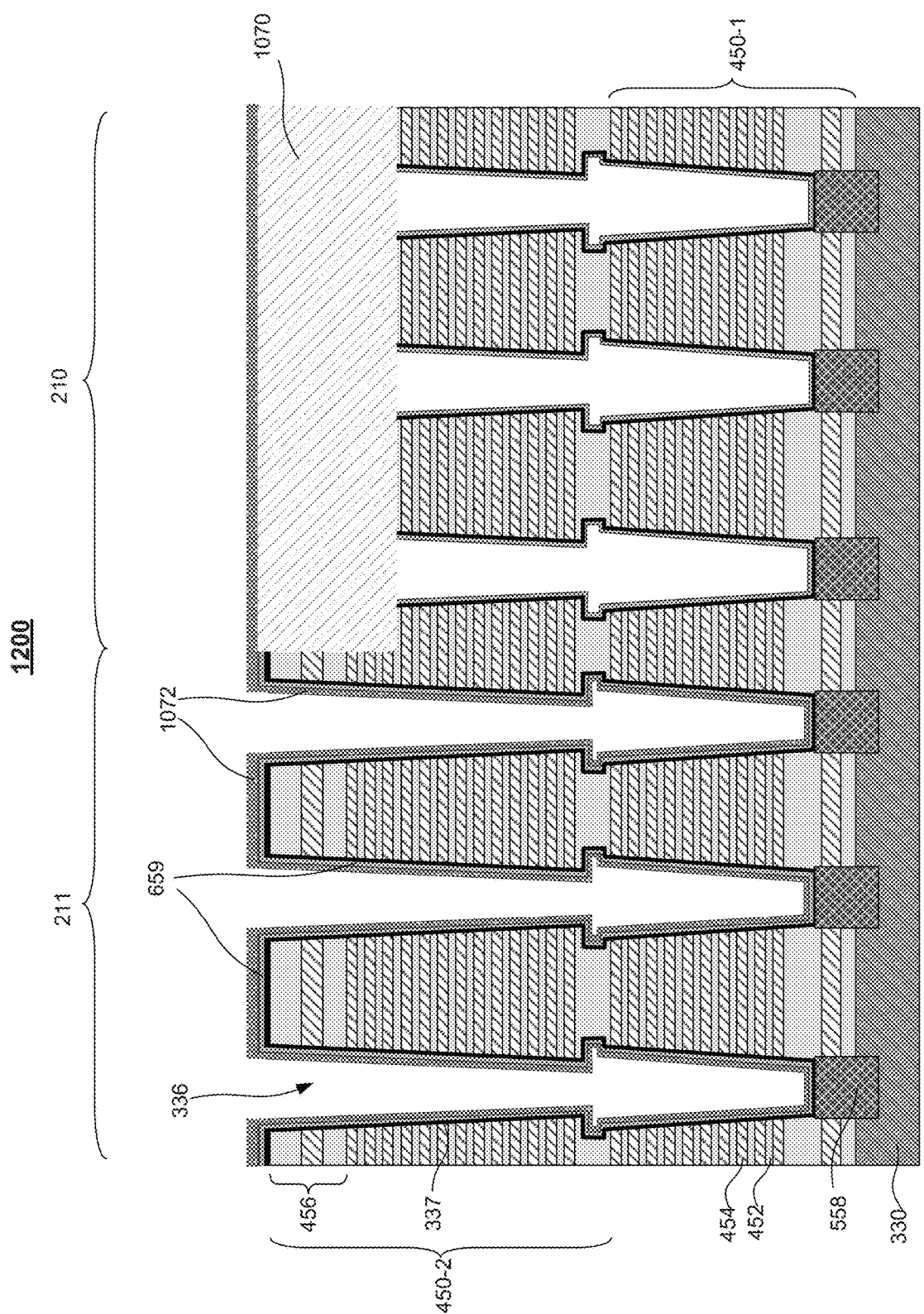

FIG. 12 illustrates a cross-sectional view of a 3D memory device 1200, according to some embodiments of the present disclosure. The 3D memory device 1200 includes a second capping layer 1072, disposed on the 3D memory device 1100 (in FIG. 11). In the channel structure region 211, the second capping layer 1072 covers the first capping layer 659 inside the channel holes and on top of the channel connecting layer 456. The second capping layer 1072 also covers the second mask (i.e., the second photoresist mask 1070 in the staircase region 210). The second capping layer 1072 includes silicon oxide, silicon oxynitride, silicon nitride, or any other suitable dielectric materials. The second capping layer 1072 can be deposited by CVD, PVD, sputtering, etc.

Figure 13:
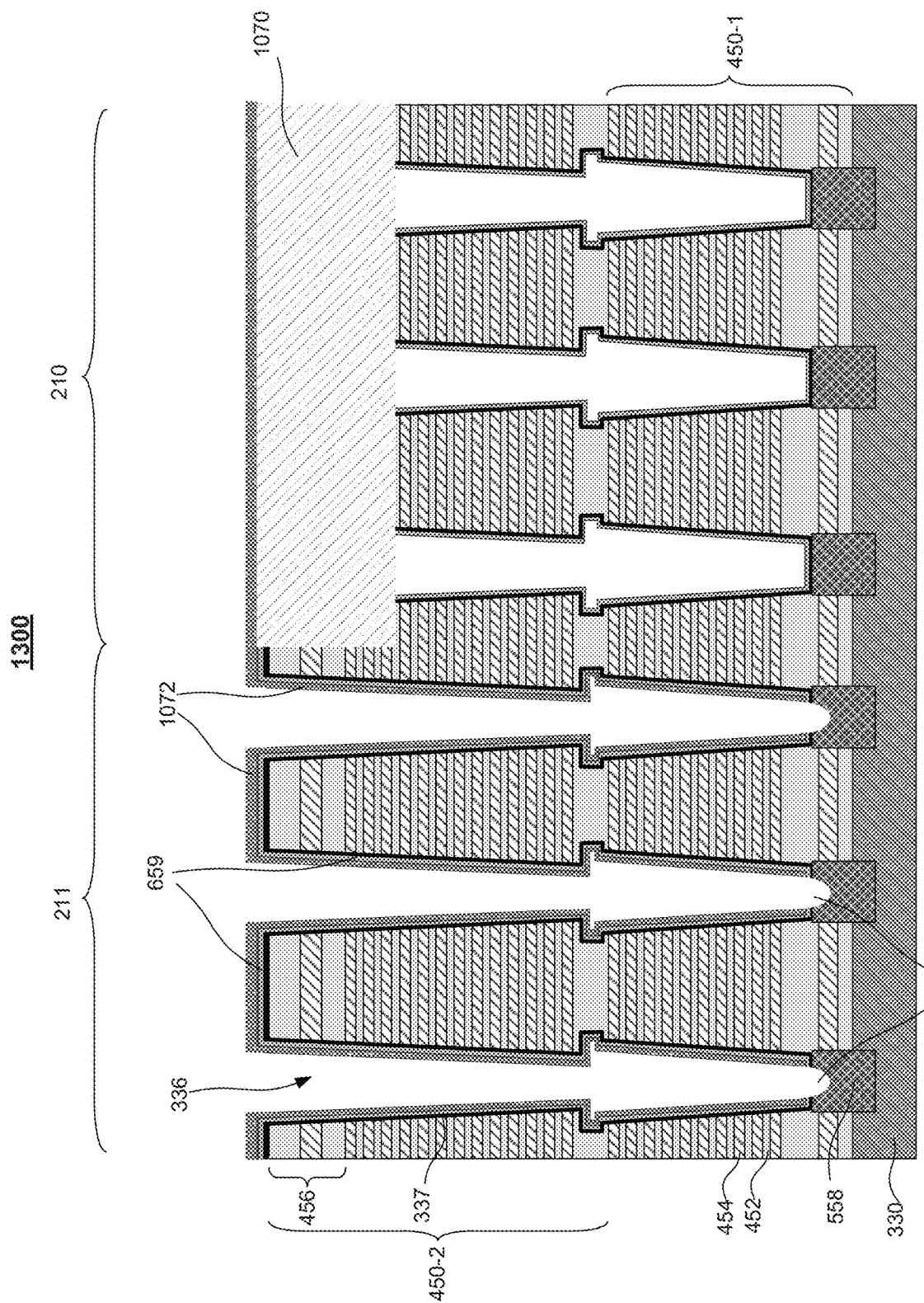

FIG. 13 illustrates a cross-sectional view of a 3D memory device 1300, according to some embodiments of the present disclosure. The 3D memory device 1300 includes a dip 1374 at a bottom of each channel hole 336 in the channel structure region 211, where the channel holes are not covered by the second photoresist mask 1070. Accordingly, the channel hole 336 in the channel structure region 211 extends into the epitaxial layer 558 via the dip 1374.

The dip 1374 can be formed by dry etching, for example, RIE with chemical gases such as $CF_4$, $CHF_3$, $C_2F_6$, or $C_3F_6$ and/or other suitable etchants. During the etching process, a polymer film (not shown) can be deposited to protect the second capping layer 1072 on sidewalls of the channel holes 336, on top surface of the channel connecting layer 456, and on top of the second photoresist mask 1070. The etching process removes the second capping layer 1072, the first capping layer 659 and the memory film 337 at the bottom of the channel holes in the channel structure region 211. Therefore, at least a portion of the epitaxial layer 558 is exposed inside the channel hole 336 in the channel structure region 211 after forming the dip 1374. In some embodiments, the dip 1374 can have a depth in a range between 5 nm to 100 nm and a width in a range between 10 nm to 100 nm.

Figure 14:
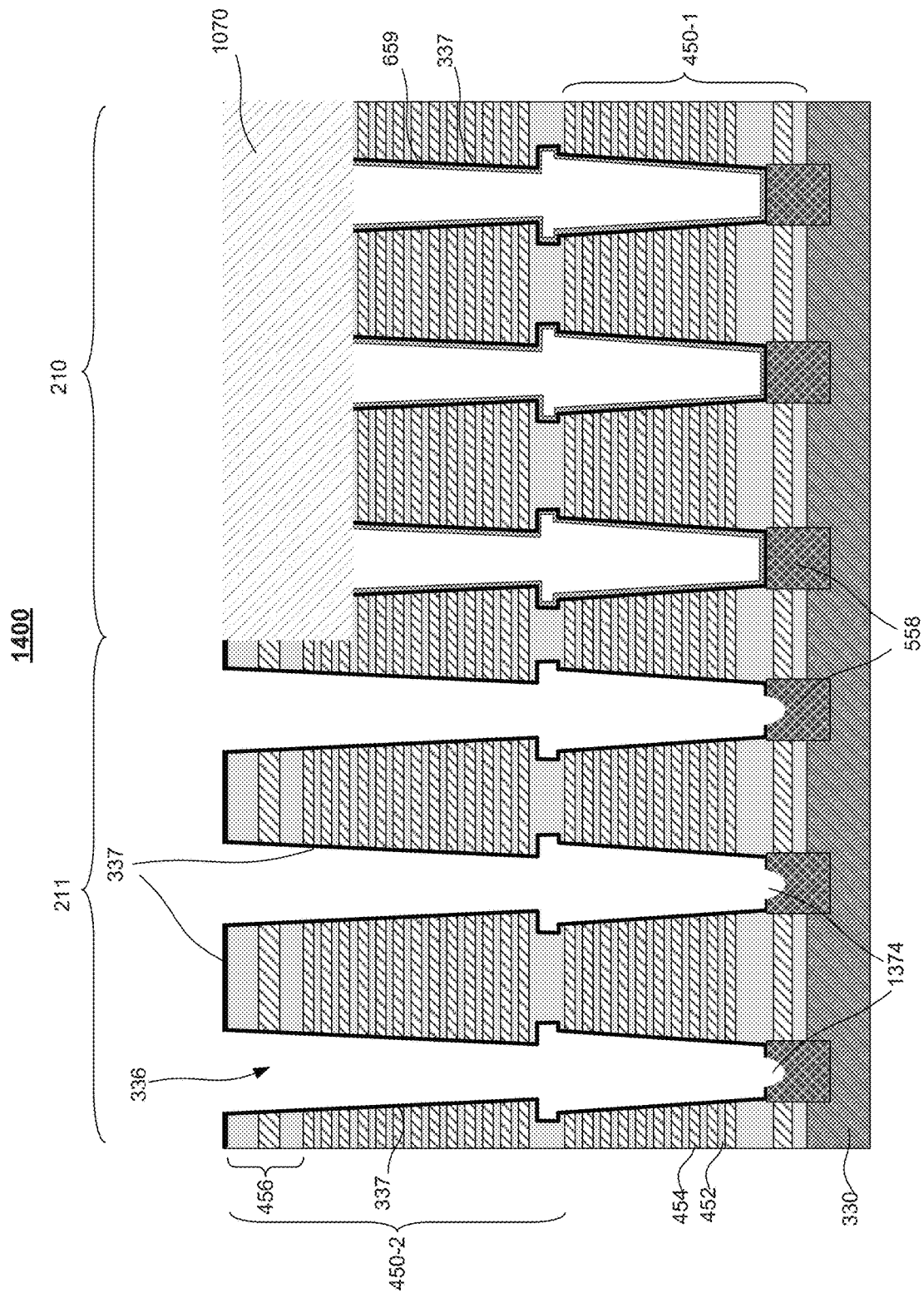

FIG. 14 illustrates a cross-sectional view of a 3D memory device 1400, according to some embodiments of the present disclosure. The 3D memory device 1400 can be formed by removing the first and second capping layers 659/1072 from the 3D memory device 1300 in FIG. 13. In the 3D memory device 1400, the memory film 337 is exposed inside the channel hole 336 in the channel structure region 211. In the staircase region 210, the memory film 337 is covered by the first capping layer 659, while the epitaxial layer 558 is covered by the memory film 337 and the first capping layer 659.

By using the second photoresist mask 1070, structures in the staircase region 210 are not exposed during the formation of the dip 1374 and the removal of the first/second capping layers 659/1072. Therefore damages of memory film 337 in the dummy area (i.e., the staircase region 210) can be avoided.

Figure 15:
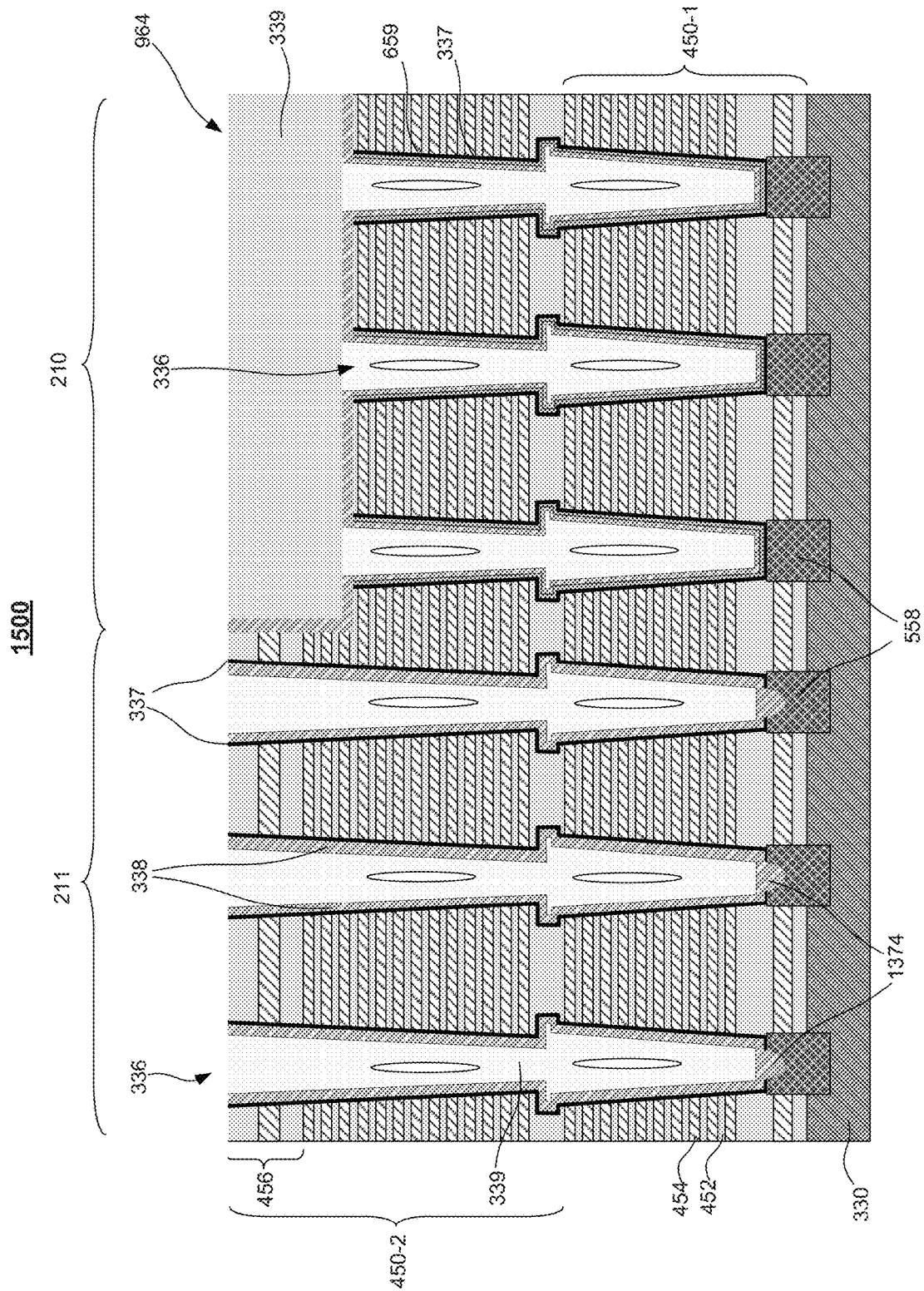

FIG. 15 illustrates a cross-sectional view of a 3D memory device 1500, according to some embodiments of the present disclosure. The 3D memory device 1500 can be formed by removing the second photoresist mask 1070 from the 3D memory device 1400 in FIG. 14, followed by disposing a channel layer 338 and a core filling film 339.

In the channel structure region 211, the channel layer 338 covers a sidewall of the memory film 337 inside the channel hole 336 and is connected with the epitaxial layer 558 through the dip 1374. In the staircase region 210, the channel layer 338 can be formed on sidewalls of the channel holes 336 and the recess 964.

The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, or a combination thereof. In some embodiments, a thickness of the channel layer 338 can be in a range from about 10 nm to about 30 nm.

In some embodiments, the core filling film 339 can be disposed to fill each channel hole 336 in the channel structure region 211 and the staircase region 210, as well as the recess 964. In some embodiments, the middle of the core filling film 339 can include one or more airgaps. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited by using, for example, ALD, PVD, CVD, spin-coating, sputtering, or any other suitable film deposition techniques. The core filling film 339 can also be formed by using repeated deposition and etch-back processes. The etch-back process can include, but not limited to, a wet etching, a dry etching, or a combination thereof.

In some embodiments, the core filling film 339, the channel layer 338 and the channel connecting layer 456 are coplanar in the 3D memory device 1500. The planarization process includes chemical mechanical polishing, RIE, wet etching, or a combination thereof. The planarization process removes excess core filling film 339, channel layer 338 and the memory film 337 outside the channel hole 336 and the recess 964. Accordingly, in the channel structure region 211, the channel layer 338 and the memory film 337 can be disconnected between adjacent channel holes 336.

Figure 16:
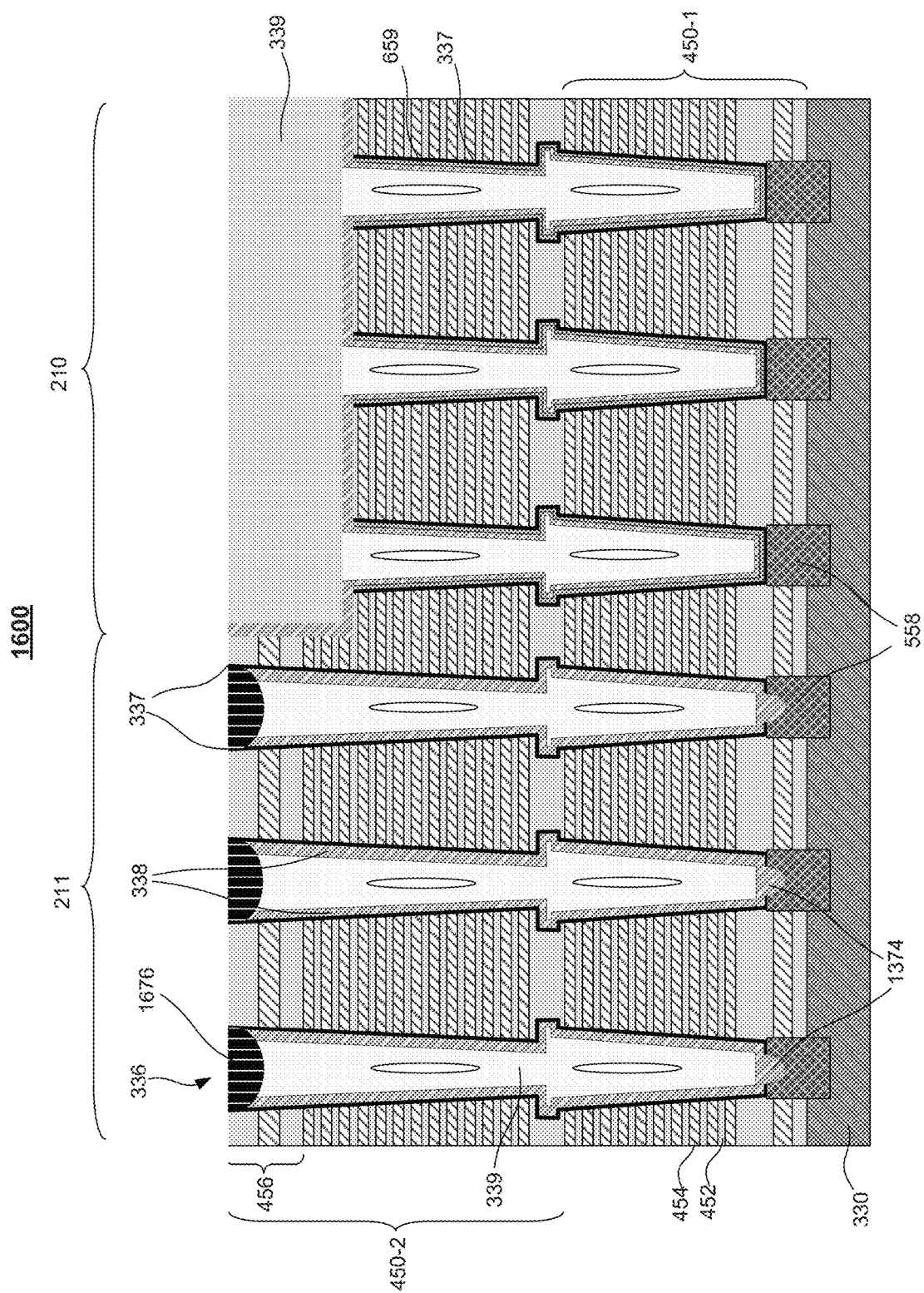

FIG. 16 illustrates a cross-sectional view of a 3D memory device 1600, according to some embodiments of the present disclosure. The 3D memory device 1600 includes a top contact structure 1676 formed on a top portion of each channel hole 336 in the channel structure region 211.

The top contact structure 1676 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The top contact structure 1676 can be formed by a recess etching process followed by thin film deposition. The recess etching process includes wet etch, dry etch or a combination thereof. The thin film deposition includes CVD, PVD, ALD, sputtering, or any other suitable processes.

The top contact structure 1676 can form electrical contact with the channel layer 338 inside each channel hole 336 in the channel structure region 211, where the channel layer 338 is connected with the epitaxial layer 558 via the dip 1374.

As shown in FIG. 16, the 3D memory device 1600 has a planar top surface, which can be formed by a planarization process such as chemical mechanical polishing (CMP). Through the planarization process, excess top contact structure 1676 outside the channel holes 336 can be removed.

Fabrication processes can resume to form a functional dual deck 3D memory, for example, as shown in FIG. 3, forming slit structures 216, replacing the second dielectric layers 454 with a conductive material to form the film stack 335 of alternating conductive and dielectric layers, forming contact structures 214 and metal interconnect lines 343 for word lines 333 and bit lines 341, etc. These processes and resulting structures are known to those skilled in the art and thus are not included in this disclosure.

Figure 17:
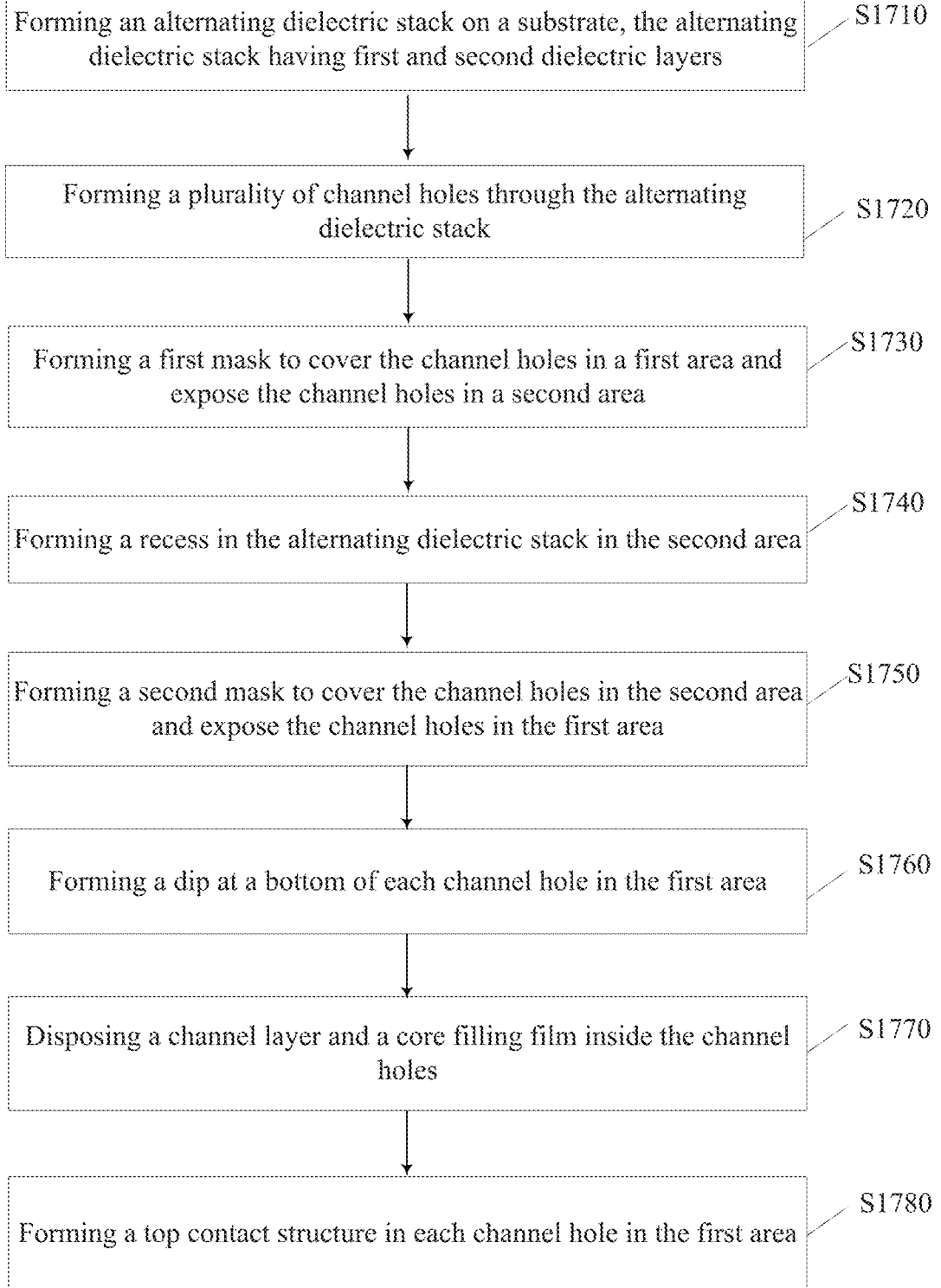
FIG. 17 illustrates a flow diagram of an exemplary method for forming a 3D memory device in accordance with some embodiments of the present disclosure.

FIG. 17 illustrates an exemplary fabrication process 1700 for forming 3D memory devices shown in FIGS. 4-16, accordance to some embodiments of the present disclosure. It should be understood that the operations shown in fabrication process 1700 are not exhaustive and that other operations can be performed as well before, after, or between any of the illustrated operations. In some embodiments, some process steps of exemplary fabrication process 1700 can be omitted or other process steps can be included, which are not described here for simplicity. In some embodiments, process steps of fabrication process 1700 can be performed in a different order and/or vary.

As shown in FIG. 17, fabrication process 1700 starts at process step S1710, in which an alternating dielectric stack (e.g., the alternating dielectric stack 450 in FIG. 4) can be formed on a substrate 330, the alternating dielectric stack having a first dielectric layer (e.g., the first dielectric layer 452) and a second dielectric layer (e.g., the second dielectric layer 454). In some embodiments, the alternating dielectric stack 450 includes an upper deck 450-2 and a lower deck 450-1.

In some embodiments, the first dielectric layer 452 and the second dielectric layer 454 can include any suitable insulator, where the second dielectric layer 454 is different from the first dielectric layer 452. In some embodiments, the first dielectric layer 452 can be silicon oxide and the second dielectric layer 454 can be silicon nitride. The alternating dielectric stack 450 can be formed by one or more thin film deposition processes such as CVD, PVD, ALD, sputtering, or any combination thereof.

In some embodiments, after disposing the alternating dielectric stack 450 on the substrate 330, a staircase structure (see FIG. 3) can be formed at an end of the alternating dielectric stack 450 by using multiple etch-trim processes.

At process step S1720, a plurality of channel holes (e.g., the channel holes 336 in FIG. 5) can be formed, penetrating the entire alternating dielectric stack 450 and exposing at least a portion of the substrate 330. The forming of the channel holes 336 can include processes such as photolithography and etching, for example, anisotropic reactive ion etching (RIE). In some embodiments, a subsequent wet process can be used to clean the channel holes 336 to remove possible polymer or by-products from the RIE process.

In some embodiments, an epitaxial layer (e.g., the epitaxial layer 558 in FIG. 5) can be deposited inside the channel holes 336 to form an epitaxial plug. In one example, the epitaxial layer 558 can be deposited by using selective epitaxy, where a semiconductor layer (for example silicon) can only grow from (or be deposited on) the exposed portion of the substrate 330, not on any dielectric film (e.g., the first and second dielectric layers 452/454). In some embodiments, the epitaxial layer 558 can be doped by in-situ doping during epitaxy or by subsequent ion-implantation.

In some embodiments, a memory film and a first capping layer (e.g., the memory film 337 and the first capping layer 659 in FIG. 6) can be disposed sequentially inside the channel holes 336. In some embodiments, the memory film 337 includes ONO dielectrics (e.g., a tunneling layer including silicon oxide, a storage layer including silicon nitride, and a blocking layer including silicon oxide). In some embodiments, the memory film 337 can also include high-k dielectrics. In some embodiments, the first capping layer 659 includes amorphous or polycrystalline silicon, silicon oxide, silicon oxynitride, silicon nitride, or a combination thereof.

At process step S1730, a first mask is formed over the channel holes 336 in a first area (e.g., the channel structure region 211 in FIGS. 2 and 7). In some embodiments, the first mask can include the first photoresist mask 762 and the hard mask layer 760 in FIG. 7, where the hard mask layer 760 includes an un-conformal film (e.g., the amorphous carbon layer 760-1) that does not fill inside the channel holes 336. The pattern of the first photoresist mask 762 can be transferred to the underlying hard mask layer 760 through wet etching and/or dry etching. As a result, the channel holes 336 in the first area (e.g., the channel structure region 211) are covered by the first mask (e.g., the hard mask layer 760) and the channel holes in a second area (e.g., the staircase region 210 in FIGS. 2 and 8) are exposed.

At process step S1740, a top portion of the alternating dielectric stack is removed in the staircase region 210 using the patterned hard mask layer 760. Accordingly, a recess is formed in the second area (e.g., the staircase region 210). FIG. 9 shows an exemplary structure where the top three pairs of first/second dielectric layers 452/454 are removed along with the channel connecting layer 456 to form the recess 964 in the staircase region 210.

At process step S1750, a second mask (e.g., the second photoresist mask 1070 in FIGS. 10 and 11) are formed to cover the channel holes in the second area (e.g., the staircase region 210). The viscosity of the second photoresist mask 1070 can be selected such that the second photoresist mask 1070 fills the recess 964 of larger dimension, while the second photoresist mask 1070 does not fill inside the channel holes of smaller dimensions.

In some embodiments, the second photoresist mask 1070 can be planarized with top surfaces of the channel connecting layer 456. The planarization process includes dry etch, wet etch, chemical mechanical polishing, or a combination thereof.

At process step S1760, a dip (e.g., the dip 1374 in FIG. 14) is formed at the bottom of each channel hole 336 in the channel structure region 211. The dip 1374 can be formed by dry etching through the memory film 337 on the bottom of the channel hole 336. In some embodiments, the dip 1374 extends through the first capping layer 659. Thus, at least a portion of the epitaxial layer 558 is exposed inside the channel hole 336 in the channel structure region 211.

In some embodiments, a dielectric layer (e.g., the second capping layer 1072 in FIGS. 12 and 13) can be disposed prior to forming the dip 1374. The second capping layer 1072 can be used to protect the memory film 337 on the sidewalls of the channel hole during the etching process for the dip 1374. This dielectric layer at the bottom of the channel holes in the first area can be etched along with the memory film 337 during the formation of the dip 1374.

The second capping layer 1072 and the first capping layers 659 can be stripped after forming the dip 1374 to expose the memory film 337 inside the channel holes in the channel structure region 211. And then the second photoresist mask 1070 can be removed.

At process step S1770, a channel layer and a core filling film (e.g., the channel layer 338 and the core filling film 339 in FIG. 15) are disposed on the memory film 337 inside the channel hole 336 in the first area. The channel layer and the core filling film can also be disposed inside the channel hole 336 and in the recess 964 in the second area. In some embodiments, the channel layer 338 can be an amorphous silicon layer or a polycrystalline silicon layer and the core filling film 337 can be silicon oxide. The channel layer 338 and the core filling film 339 can be formed by using a thin film deposition process, such as a CVD, PVD, ALD, etc.

In some embodiments, a planarization process (e.g., chemical mechanical polishing) can be used to remove excess memory film 337, channel layer 338 and core filling film 339 outside the channel holes 336 to form a planarized top surface.

At process step S1780, a top contact structure (e.g., the top contact structure 1676 in FIG. 16) can be formed for each channel hole in the first area (e.g., channel structure region 211). The top contact structure 1676 can be formed by recessing the core filling film 339 using an etching process (e.g., RIE) to form a contact recess inside the channel hole 336, followed by a thin film deposition of a semiconductor material (e.g., amorphous or polycrystalline silicon) in the contact recess. In some embodiments, the top contact structure 1676 includes metal, metal alloy or silicide. The top contact structure 1676 is connected with the channel layer 338 and can function as an electrical contact for the channel layer 338. A planarization process (e.g., chemical mechanical polishing) can be used to remove the semiconductor material outside the channel holes 336 to form a planarized top surface.

Fabrication processes to form a functional 3D memory can resume. For example, a film stack of alternating conductive and dielectric layers can be formed by replacing the second dielectric layer with a conductive layer.

In summary, the present disclosure describes various embodiments of a 3D memory device and methods of making the same.

One aspect of the present disclosure provides a method for forming a three-dimensional (3D) memory device that includes forming an alternating dielectric stack on a substrate, and forming a plurality of channel holes, where the plurality of channel holes penetrate the alternating dielectric stack vertically, in a direction perpendicular to the substrate, to expose at least a portion of the substrate. The method also includes forming a first mask covering the plurality of channel holes in a first area and exposing the plurality of channel holes in a second area. The method further includes forming a recess in the alternating dielectric stack in the second area. The method also includes forming a second mask in the recess, where the second mask covers the plurality of channel holes in the second area and exposes the plurality of channel holes in the first area. The method further includes forming dips at bottom of the plurality of channel holes in the first area.

Another aspect of the present disclosure provides a dual deck three-dimensional (3D) memory device that includes an alternating dielectric stack with an upper deck and a lower deck disposed on a substrate, each deck comprising alternatingly stacked first and second dielectric layers in a direction perpendicular to the substrate, where the second dielectric layer is different from the first dielectric layer. The dual deck 3D memory device also includes a plurality of channel holes penetrating through the upper and lower decks of the alternating dielectric stack into the substrate. The dual deck 3D memory device further includes a memory film, a channel layer, and a core filling film covering a sidewall of each of the plurality of channel holes. The dual deck 3D memory device also includes a dip at a bottom of each of the plurality of channel holes in a first area, and a recess in the upper deck of the alternating dielectric stack in a second area.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an alternating dielectric stack on a substrate;
    forming a plurality of channel holes, wherein the plurality of channel holes penetrate the alternating dielectric stack vertically, in a direction perpendicular to the substrate, to expose at least a portion of the substrate;
    forming a first mask covering the plurality of channel holes in a first area and exposing the plurality of channel holes in a second area;
    forming a recess in the alternating dielectric stack in the second area;
    forming a second mask in the recess, wherein the second mask covers the plurality of channel holes in the second area and exposes the plurality of channel holes in the first area; and
    forming dips at bottom of the plurality of channel holes in the first area.

2. The method of claim 1, wherein forming the first mask comprises:
    disposing a hard mask layer covering the plurality of channel holes in the first area, wherein the hard mask layer does not fill inside the plurality of channel holes;
    forming a first photoresist mask on top of the hard mask layer; and
    transferring patterns of the first photoresist mask to the hard mask layer.

3. The method of claim 2, wherein disposing the hard mask layer comprises disposing an amorphous carbon layer.

4. The method of claim 1, wherein forming the alternating dielectric stack comprises:
    forming a plurality of dielectric layer pairs stacked vertically in the direction perpendicular to the substrate, wherein each dielectric layer pair comprises a first dielectric layer and a second dielectric layer that is different from the first dielectric layer.

5. The method of claim 4, wherein forming the recess in the alternating dielectric stack comprises removing one or more pairs of the first and second dielectric layers.

6. The method of claim 1, further comprising:
    after forming the plurality of channel holes, disposing epitaxial layers on the exposed portion of substrate inside the plurality of channel holes.

7. The method of claim 6, further comprising:
    disposing a memory film on sidewalls of the plurality of channel holes and top surfaces of the epitaxial layers.

8. The method of claim 7, further comprising:
    disposing a first capping layer on the memory film.

9. The method of claim 7, further comprising:
    after forming the dips at the bottom of the plurality of channel holes in the first area, disposing a channel layer on sidewalls of the memory film and on the epitaxial layers inside the plurality of channel holes;
    disposing a core filling film inside the plurality of the channel holes; and
    removing excess core filling film, channel layer and memory film outside the plurality of channel holes.

10. The method of claim 9, wherein removing the excess core filling film, channel layer and memory film outside the plurality of channel holes comprises chemical mechanical polishing.

11. The method of claim 9, further comprising:
    after removing the excess core filling film, channel layer and memory film outside the plurality of channel holes, forming top contact structures in upper portions of the plurality of channel holes in the first area, wherein the top contact structures are connected with the channel layers inside the plurality of the channel holes.

12. The method of claim 1, wherein forming the second mask in the recess comprises:
    disposing a second photoresist mask over the alternating dielectric stack in the second area, wherein the second photoresist mask is outside the plurality of channel holes; and
    planarizing the second photoresist mask to form a top surface coplanar with the alternating dielectric stack.

13. The method of claim 1, wherein forming the dips at the bottom of the plurality of channel holes in the first area comprises:
    disposing a second capping layer inside the plurality of channel holes in the first area and on top of the second mask in the second area;
    removing the second capping layer from the bottom of the plurality of channel holes in the first area to expose the substrate or an epitaxial layer on the substrate.

14. The method of claim 1, further comprising:
    replacing the alternating dielectric stack with a film stack of alternating conductive and dielectric layers.

* * * * *